US006541341B1

(12) United States Patent
Son et al.

(10) Patent No.: US 6,541,341 B1
(45) Date of Patent: Apr. 1, 2003

(54) METHOD FOR FABRICATING MOS FIELD EFFECT TRANSISTOR

(75) Inventors: Jeong-Hwan Son, Daejon (KR); Sang-Don Lee, Choongcheongbuk-Do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 1138 days.

(21) Appl. No.: 08/675,865

(22) Filed: Jul. 5, 1996

(30) Foreign Application Priority Data

Dec. 29, 1995 (KR) .......................................... 95/67322

(51) Int. Cl.[7] .......................................... H01L 21/265

(52) U.S. Cl. ...................... 438/289; 438/307; 438/527

(58) Field of Search .............................. 438/289, 290, 438/291, 299, 301, 303, 307, 282, 514, 527

(56) References Cited

U.S. PATENT DOCUMENTS 5,081,052 A * 1/1992 Kobayashi et al. ......... 438/290
5,185,279 A * 2/1993 Ushiku ...................... 438/290
5,413,949 A * 5/1995 Hong ........................ 438/291
5,464,782 A * 11/1995 Koh .......................... 438/303
5,548,143 A * 8/1996 Lee ........................... 438/291
5,605,855 A * 2/1997 Chang ........................ 438/45
5,614,430 A * 3/1997 Liang et al. ................ 438/291

OTHER PUBLICATIONS

"A New p–Channel MOSFET with Large–Tilt–Angle Implanted Punchthrough Stopper (LATIPS)," by Takashi Hori et al., IEEE Electron Device Letter, vol. 9, No. 12, Dec. 1988.

* cited by examiner

*Primary Examiner*—Savitri Mulpuri
(74) *Attorney, Agent, or Firm*—Fleshner & Kim, LLP

(57) ABSTRACT

A method for fabricating a MOSFET includes a step of forming an isolation layer on an isolation region of a substrate, to thereby define an active region ion implanting As and P into the active region, and a step of forming a gate on the active region. An ion implanting step of low-concentration impurity using the gate as a mask is performed to form a low-concentration ion-implanted region in a predetermined portion of the substrate which is placed on the right and left sides of the gate. A sidewall spacer on the sides of the gate is formed, and thereafter, and ion implanting high-concentration impurity into the substrate is performed.

15 Claims, 2 Drawing Sheets

21 15 14 15 21
12 12
21' 23 13 17' 23 21'
11

METHOD FOR FABRICATING MOS FIELD EFFECT TRANSISTOR

TECHNICAL FIELD

The present invention relates to a method for fabricating a MOS field effect transistor (MOSFET) and, more particularly, to a method for fabricating a MOSFET with at least two dopants from Group V to reduce short channel effect.

BACKGROUND ART

In a conventional p-channel MOSFET, a substrate is ion implanted with arsenic (As) or phosphorus (P) dopants to prevent punch through effects. Alternatively, phosphorus P is halo-implanted into a substrate, as shown in FIG. 1, to form a halo structure around source and drain regions which reduces the short channel effect. This prevents the threshold voltage (vt) lowering phenomenon, for example, Vt roll-off phenomenon, caused by the reduction of the size of the semiconductor device into a-deep submicron. The halo structure also increases the current driving capability.

FIGS. 1A–1C illustrate a method for fabricating a conventional p-channel MOSFET using a large angle tilt implanted punchthrough stopper (LATIPS) technology. An n+ LATIPS region 5 is easily formed by large-angle tilt (LAT) ion implantation without p+ ion implantation using a spacer, and the aforementioned LATIPS technology is the same as that for fabricating a conventional 0.5 $\mu$m CMOS having a 10 nm-thick gate oxide layer.

As shown in FIG. 1A, boron fluoride ($BF_2$) at a dose and an energy level of $1.7\times10^{12}$ $cm^{-2}$ and 50 keV, respectively, is ion-implanted into an n-well 1, resulting in a surface concentration of $1\times10^{16}$ $cm^{-1}$, to form a counter-doped p-channel region 2 of 0.17 $\mu$m thickness. A gate oxide 3 is deposited on a p-channel region 2, and then a gate pattern 4 with <100> orientation is formed on the gate oxide 3.

As shown in FIG. 1B, phosphorus P ($2\times10^{13}cm^{-2}$ dose) is ion-implanted at a large angle tilt of 25° and at an energy level of 90 keV to form an n+ LATIPS region 5 in a predetermined portion of the n-well 1 and p-channel region 2. The LAT ion implantation is repeated two to four times depending on the orientation of the gate pattern 4.

As shown in FIG. 1C, boron fluoride $BF_2$ is ion-implanted at a dose of $3\times10^{15}$ $cm^{-2}$ and at an energy level of 40 keV, using the gate pattern 4 as a mask, resulting in a p+ source/drain region 6 having a junction depth of about 0.20 $\mu$m in a substrate portion on the right and left side of gate pattern 4. A halo-structure n+ region 5' having a length of about 0.06 $\mu$m and an n-type peak concentration of about $1.5\times10^{17}cm^{-3}$ is formed between the p-channel region 2 and the p+ source/drain region 6, but closer to the p+ source/drain region 6. Although the short channel effect is reduced, tilt E ion implantation is repeatedly performed based on orientation of the polysilicon gate, resulting in complex fabrication with increased cost.

Disclosure of the Invention

An advantage of the present invention is a simpler method of making a MOSFET with reduced short channel effect.

The above and other advantages of the invention are achieved, at least in part by a method of fabricating a field effect transistor comprising the steps of: a) doping an area of a substrate with at least two different dopants from Group V;. b) forming a gate on the area; and c) forming source and drain regions adjacent to the gate in the area.

Additional advantages , objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims

BRIEF DESCRIPTION OF THE DRAWINGS

The invention will be described in detail with reference to the following drawings in which like reference e numerals refer to like elements wherein.

BEST MODE FOR CARRYING OUT THE INVENTION

The phosphorus P used in a deep-channel ion implanting process prevents the punchthrough effect in a p-channel MOSFET. However, the diffusion of phosphorus P around the source and drain increases, and the concentration of phosphorus P increases on the substrate surface near the side edge of the gate, resulting in reverse short channel effect, and deterioration of the punchthrough stopping characteristics.

These deleterious effects are caused due to the oxidation enhanced diffusion during gate reoxidation, Channel Effects Due To Gate Reoxidation Induced Lateral Interstitial Diffusion", or are caused by silicon interstitial injection during source/drain ion implantation, which was reported in an article by T. Kunikiyo et al. in IEEE Trans., Computer-Aided Design, vol. 13, p. 507, 1994, entitled "Reverse Short Channel Effect Due To Lateral Diffusion Of Point-Defect Induced By Source/Drain Ion Implantation".

However, when arsenic As is used, the diffusion coefficient of As is smaller than phosphorus P. Hence, the aforementioned phenomena rarely occurs. In the present invention, arsenic As and phosphorus P ions are implanted together during the deep channel ion implantation during the fabricating of a MOSFET. The Vt roll-off characteristics are improved since the reverse short channel effect occurs.

Figure 1A:
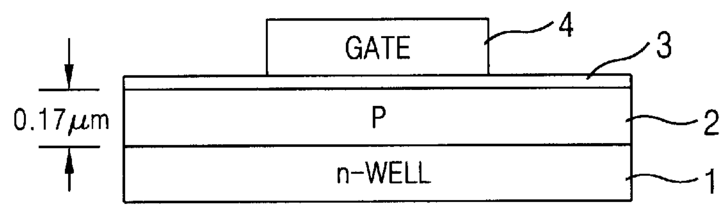
FIGS. 1A–1C depict a method for fabricating a conventional MOSFET having LATIPS.
Figure 1B:
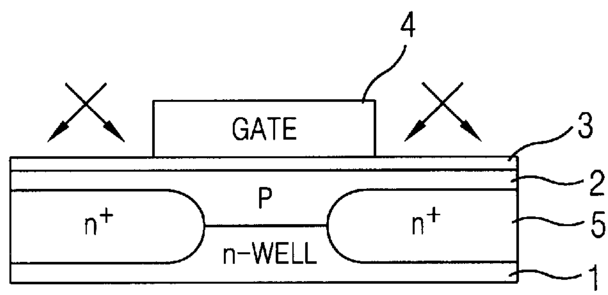
Figure 1C:
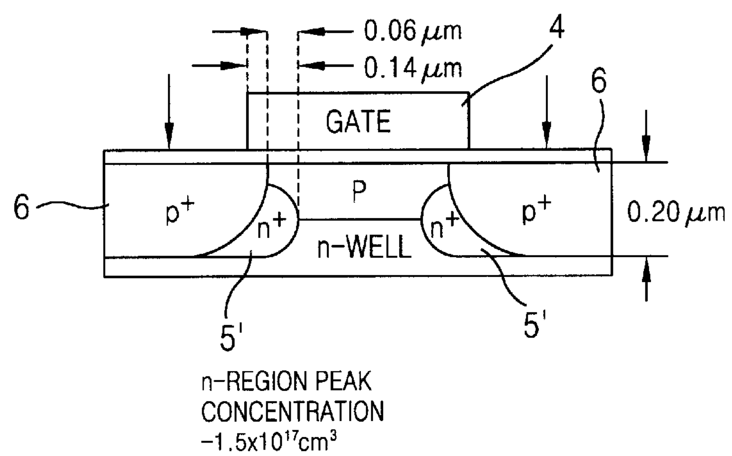
Figure 2A:
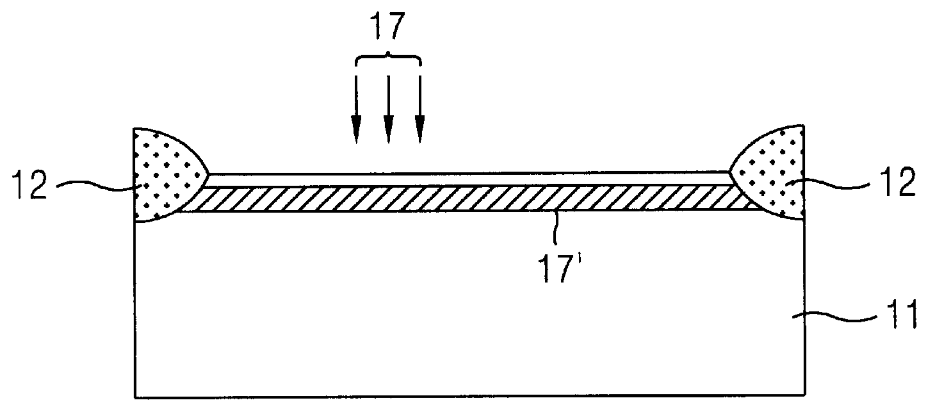
FIGS. 2A–2C depict a method for fabricating a MOSFET in accordance with the present invention.

As shown in FIG. 2A, an isolation layer 12 is formed on an isolation region of a substrate 11, to define an active region. Arsenic As and phosphorus P are ion-implanted into the active region of substrate 11 to form arsenic As and phosphorus P ion-implanted region 17' in the substrate. Arsenic As is implanted at a dose of about $1\times10^{12}$ to $1\times10^{13}$ $cm^{-2}$ and at an energy level of about 100 to 200 keV, and phosphorus P is implanted at a dose of about $1\times10^{12}$ to $1\times10^{13}$ $cm^{-2}$ and at an energy level of about 80 to 200 keV. The dopants As and P may be ion-implanted in any order. In other words, phosphorus P can be implanted first, and then, arsenic As may be implanted, or arsenic As may be implanted first, and then phosphorus P may be implanted.

Figure 2B:
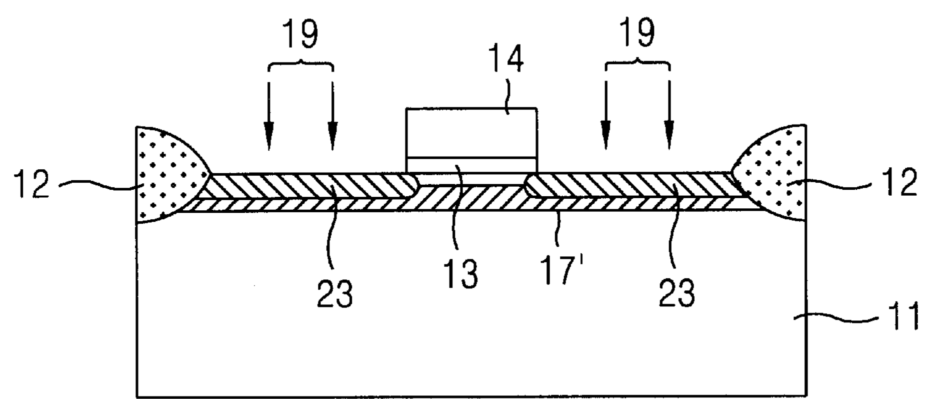

As shown in FIG. 2B, a gate oxide 13 of about 30 to 100 angstroms (Å) is formed by thermal oxidation and a p+ polysilicon layer is sequentially deposited on the active region of the substrate 11. The p+ polysilicon layer is selectively etched through photolithography to form a gate 14, and then the gate oxide layer 13 is etched using the gate 14 as a mask. Then, a low-concentration (dose of about $1\times10^{13}$ to $1\times10^{14}$ $cm^{-2}$) of p-type impurity (e.g., Boron Fluoride $BF_2$) is implanted (19) into a low-concentration ion-implanted region in a substrate (11) to form a p-type lightly doped drain (LDD) region 23 on the right and left sides of the gate 14 at an energy level of about 10–50 keV.

Figure 2C:
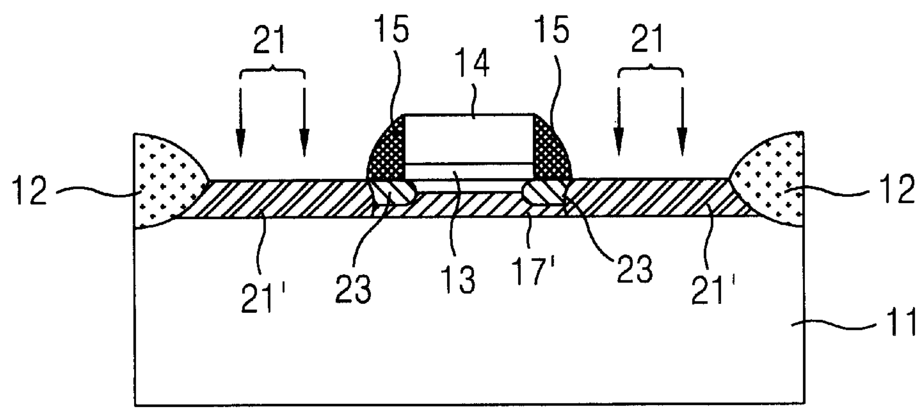

As shown in FIG. 2C, a sidewall spacer 15 made of oxide or nitride is formed on both sides of the gate oxide layer 13 and the gate 14 and has a thickness of 500–3,000 Å near the bottom of the gate. To form the side wall 15, an oxide or a nitride is formed by CVD and thereafter, anisotropically etched to expose the surface of the substrate. A high-concentration of p-type impurity is ion-implanted (21) into the substrate using the gate 14 and the sidewall spacer 15 as a mask, to form a source/drain region 21' in a predetermined portion of the substrate 11. The p-type impurity may be boron (B) or boron fluoride ($BF_2$) at a dose of about $1\times10^{15}$ to $3\times10^{15}$ $cm^{-2}$. The boron (B) is implanted at an energy level of about 10–20 keV, and boron fluoride ($BF_2$) at an energy level of about 10–50 keV.

As described above, the present invention eliminates repeating tilt ion implantation of the background art. The present invention improves the Vt roll-off and DIBL characteristics, and prevents the punchthrough effect. As a result, the method is simplified while reducing the short channel effect of a MOSFET.

The foregoing embodiment is merely exemplary and not to be construed as limiting the present invention. The present oxide protection scheme can be readily applied to other field effect transistors. One of ordinary skill in the art can use the teachings of the present invention to other devices requiring reduced short channel effect. The description of the present invention is intended to be illustrative, and not limiting the scope of the claims. For example, when the gate is made of n+ polysilicon, arsenic As and phosphorus P are ion-implanted and boron B or boron fluoride ($BF_2$) are also implanted to counter dope the surface of the substrate. Many alternatives, modifications and variations will be apparent to those skilled in the art.

What is claimed is:

1. A method of fabricating a field effect transistor comprising the steps of:

a) doping an area of a substrate with phosphorus and arsenic dopants, wherein the arsenic dopant is doped at a depth in the substrate greater than a depth of the phosphorus dopant in the substrate b) forming a gate on the area; and c) forming source and drain regions adjacent to the gate in the area.

2. The method of claim 1, wherein phosphorous is ion implanted at a dopant concentration of about $1\times10^{12}$ to $1\times10^{13}$ $cm^{-2}$ and at an energy level of about 80 keV.

3. The method of claim 1, wherein arsenic is ion implanted at a dopant concentration of about $1\times10^{12}$ to $1\times10^{13}$ $cm^{-2}$ and at an energy level of about 180 to 200 keV.

4. The method of claim 1, wherein step (a) is performed prior to steps (b) and (c).

5. The method of claim 1, wherein said gate comprises p+ polysilicon.

6. The method of claim 1, wherein said gate comprises n+ polysilicon, and further comprising the step of ion implanting boron (B) or boron fluoride ($BF_2$) into the area prior to steps (b) and (c).

7. The method of claim 1, wherein step (b) comprises the steps of:

forming an oxide layer on the doped area;

forming a polysilicon layer on the oxide layer; and etching the oxide and polysilicon.

8. The method of claim 1, wherein step (c) comprises the steps of:

ion implanting a low concentration of p-type dopants;

forming side wall spacers on opposite sides of the gate; and ion implanting a high concentration of p-type dopants.

9. The method of claim 1, wherein a doped region is formed at a predetermined distance beneath a surface of the substrate as a result of step (a).

10. A method for fabricating a MOSFET comprising the steps of:

forming an isolation layer on an isolation region of a substrate, to thereby define an active region;

ion implanting As and P into said active region, wherein said As is ion-implanted to a depth in the substrate not less than a depth of said ion-implanted P;

forming a gate on said active region;

ion implanting low-concentration impurity using said gate as a mask, to thereby form a low-concentration ion-implanted region in a predetermined portion of said substrate which is placed on the right and left sides of said gate; and forming a sidewall spacer on the sides of said gate, and ion implanting high-concentration impurity into said substrate.

11. The method for fabricating a MOSFET of claim 10, wherein said gate is formed of p+ polysilicon.

12. The method for fabricating a MOSFET of claim 10, further comprising the step of, in case that said gate is formed of n+ polysilicon, ion-implanting one of B or $BF_2$ after said ion implantation of As and P.

13. The method for fabricating a MOSFET of claim 10, wherein said As is implanted at a dose of $1\times10^{13}$ $cm^{-2}$ and at an energy level of 180 to 200 keV, said P being implanted at a dose of $1\times10^{12}$ to $1\times10^{13}$ $cm^{-2}$ and at an energy of 80 keV.

14. The method of claim 1, wherein the phosphorus dopant forms a punchthrough prevention area.

15. The method of claim 10, wherein the ion-implanted P forms a punchthrough prevention area.

* * * * *